United States Patent
Giovannini et al.

(10) Patent No.: US 10,607,685 B2
(45) Date of Patent: Mar. 31, 2020

(54) METHOD AND APPARATUS FOR CALIBRATING WRITE TIMING IN A MEMORY SYSTEM

(71) Applicant: Rambus Inc., Sunnyvale, CA (US)

(72) Inventors: Thomas J. Giovannini, San Jose, CA (US); Alok Gupta, Fremont, CA (US); Ian Shaeffer, Los Gatos, CA (US); Steven C. Woo, Saratoga, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 16/408,368

(22) Filed: May 9, 2019

(65) Prior Publication Data

US 2019/0371387 A1 Dec. 5, 2019

Related U.S. Application Data

(63) Continuation of application No. 15/872,848, filed on Jan. 16, 2018, now Pat. No. 10,304,517, which is a
(Continued)

(51) Int. Cl.
*G06F 12/00* (2006.01)
*G11C 11/4076* (2006.01)
(Continued)

(52) U.S. Cl.
CPC .......... *G11C 11/4076* (2013.01); *G06F 1/08* (2013.01); *G06F 3/0629* (2013.01); *G06F 3/0634* (2013.01); *G06F 5/06* (2013.01); *G06F 12/0646* (2013.01); *G06F 13/1689* (2013.01); *G11C 7/1078* (2013.01); *G11C 7/1087* (2013.01); *G11C 7/1093* (2013.01); *G11C 11/409* (2013.01); *G11C 29/023* (2013.01);
(Continued)

(58) Field of Classification Search
None
See application file for complete search history.

(56) References Cited

U.S. PATENT DOCUMENTS 6,643,787 B1   11/2003   Zerbe et al.
6,646,953 B1   11/2003   Stark
(Continued)

OTHER PUBLICATIONS

CN Office Action dated Jun. 12, 2018 re: CN Appln. No. 201410332249.2. 9 Pages. (W/Translation).
(Continued)

*Primary Examiner* — Midys Rojas
(74) *Attorney, Agent, or Firm* — Lance Kreisman; Peninsula Patent Group

(57) ABSTRACT

A system that calibrates timing relationships between signals involved in performing write operations is described. This system includes a memory controller which is coupled to a set of memory chips, wherein each memory chip includes a phase detector configured to calibrate a phase relationship between a data-strobe signal and a clock signal received at the memory chip from the memory controller during a write operation. Furthermore, the memory controller is configured to perform one or more write-read-validate operations to calibrate a clock-cycle relationship between the data-strobe signal and the clock signal, wherein the write-read-validate operations involve varying a delay on the data-strobe signal relative to the clock signal by a multiple of a clock period.

20 Claims, 12 Drawing Sheets

Related U.S. Application Data continuation of application No. 15/406,373, filed on Jan. 13, 2017, now Pat. No. 9,881,662, which is a continuation of application No. 14/931,513, filed on Nov. 3, 2015, now Pat. No. 9,552,865, which is a continuation of application No. 14/714,722, filed on May 18, 2015, now Pat. No. 9,177,632, which is a continuation of application No. 12/049,928, filed on Mar. 17, 2008, now Pat. No. 9,263,103.

(60) Provisional application No. 61/016,317, filed on Dec. 21, 2007.

(51) Int. Cl.
| | |
|---|---|
| G06F 5/06 | (2006.01) |
| G06F 1/08 | (2006.01) |
| G11C 7/10 | (2006.01) |
| G11C 29/02 | (2006.01) |
| G06F 13/16 | (2006.01) |
| G06F 3/06 | (2006.01) |
| G06F 12/06 | (2006.01) |
| G11C 11/409 | (2006.01) |
| G11C 11/4096 | (2006.01) |

(52) U.S. Cl.
CPC ........ *G11C 29/028* (2013.01); *G11C 11/4096* (2013.01); *G11C 2207/2254* (2013.01)

(56) References Cited

U.S. PATENT DOCUMENTS

| | | | |
|---|---|---|---|
| 6,675,272 | B2 | 1/2004 | Ware et al. |
| 6,735,709 | B1 | 5/2004 | Lee et al. |
| 6,839,393 | B1 | 1/2005 | Sidiropoulos |
| 6,842,864 | B1 | 1/2005 | Barth et al. |
| 6,873,939 | B1 | 3/2005 | Zerbe et al. |
| 6,920,540 | B2 | 7/2005 | Hampel et al. |
| 7,042,799 | B2 | 5/2006 | Cho |
| 7,197,675 | B2 | 3/2007 | Chu |
| 7,231,306 | B1 | 6/2007 | Rajan et al. |
| 7,457,174 | B2 | 11/2008 | Braun et al. |
| 7,463,534 | B2 | 12/2008 | Ku et al. |
| 7,548,601 | B2 | 6/2009 | Sidiropoulos |
| 7,590,008 | B1 | 9/2009 | Roge et al. |
| 2002/0129215 | A1 | 9/2002 | Yoo et al. |
| 2003/0117864 | A1 | 6/2003 | Hampel et al. |
| 2005/0010834 | A1 | 1/2005 | Chu |
| 2005/0071707 | A1 | 3/2005 | Hampel |
| 2005/0174878 | A1 | 8/2005 | Osaka et al. |
| 2006/0262613 | A1 | 11/2006 | Braun et al. |
| 2007/0002642 | A1 | 1/2007 | Butt et al. |
| 2007/0230266 | A1 | 10/2007 | Kao |
| 2011/0208989 | A1 | 8/2011 | Nygren et al. |

OTHER PUBLICATIONS

CN Office Action dated Sep. 27, 2012 in CN Application No. 200810093507.0, Includes English Translation. 10 pages.
CN Office Action dated Mar. 21, 2017 re: CN Appln. No. 201410332249. 2. 15 Pages. (With Translation).
CN Office Action dated of Aug. 25, 2016 re: CN Appln. No. 201410332249.2. 3 Pages. (no. Translation).
CN Rejection Decision dated Oct. 16, 2017 re: CN Appln. No. 201410332249.2. 17 Pages. (W/Translation).
Communication Pursuant to Article 94(3) EPC dated Feb. 22, 2017 re: EP Appln. No. 08731251.8. 6 pages.
EP Extended European Search Report dated Oct. 5, 2018 re: EP Appln. No. 18169715.2. 10 Pages.
EP Office Action dated Jul. 2, 2015 in EP Application No. 08731251. 8. 6 pages.
EP Response Filed on Jul. 3, 2017 to the Official Communication Pursuant to Article 94(3) EPC dated Feb. 22, 2017 re: EP Appln. No. 08731251.8. 13 Pages.
Greenberg et al., "DDR3 SDRAM Standard: Key Technology and Functional Improvements," Jul. 2007, Slideshow Presentation, JEDEC JC-45.3. 44 pages.
International Preliminary Report on Patentability dated Jul. 1, 2010 in International Application No. PCT/US2008/055661. 7 pages.
JEDEC Standard, "DDR3 SDRAM Standard," JESD79-3, Jun. 2007. 188 pages.
JP Office Action dated Feb. 9, 2017 re: JP Appln. No. 2016-038721. 6 Pages. (With Translation).
Mahajan, Raj, "Memory Design Considerations When Migrating to DDR3 Interfaces From DDR2", MemCore White Paper, Mar. 5, 2007. 9 Pages.
Moriyama et al., "DDR SDRAM Controller Using Virtex-5 FPGA Devices," Xilinx, Application Note: Virtex-5 Family, version 1.1, Jul. 14, 2006. 6 pages.
Shen, Dr. William Wu, "DDR3 Functional Outlook," Slideshow Presentation, Infineon Technologies, San Jose, CA, 2005. 31 pages.
Shen, Dr. William Wu, "System Challenges on DDR3 High Speed Clock/Address/Command Fly-by Bus Topology," Apr. 18, 2006, Slideshow Presentation, Infineon Technologies Corporation. 47 pages.
Trost, Dr. Hans-Peter, "Press Presentation DDR3 Introduction," Jun. 2005, Slideshow Presentation, Infineon Technologies AG. 11 pages.
Weidlich, Rainer, "What Comes Next in Commodity DRAMs—DDR3," Jun. 2005, White Paper, Infineon Technologies, Rev. 1.1. 4 pages.

METHOD AND APPARATUS FOR CALIBRATING WRITE TIMING IN A MEMORY SYSTEM

RELATED APPLICATIONS

This application is a Continuation application of, and hereby claims priority under 35 U.S.C. § 120 to, pending U.S. patent application Ser. No. 15/872,848, entitled "Method and Apparatus for Calibrating Write Timing in a Memory System," filed on Jan. 16, 2018, which is a Continuation application of, and hereby claims priority under 35 U.S.C. § 120 to, pending U.S. patent application Ser. No. 15/406,373, entitled "Method and Apparatus for Calibrating Write Timing in a Memory System," filed on Jan. 13, 2017, now U.S. Pat. No. 9,881,662, which is a Continuation of U.S. patent application Ser. No. 14/931,513, entitled "Method and Apparatus for Calibrating Write Timing in a Memory System," filed on Nov. 3, 2015, now U.S. Pat. No. 9,552,865, which is a Continuation of U.S. patent application Ser. No. 14/714,722, entitled "Method and Apparatus for Calibrating Write Timing in a Memory System," filed on May 18, 2015, now U.S. Pat. No. 9,177,632, which is a Continuation of U.S. patent application Ser. No. 12/049,928, entitled "Method and Apparatus for Calibrating Write Timing in a Memory System," filed on Mar. 17, 2008, by Thomas J. Giovannini, Alok Gupta, Ian Shaeffer and Steven C. Woo, now U.S. Pat. No. 9,263,103. The present application further claims priority under 35 U.S.C. § 119 to U.S. Provisional Patent Application No. 61/016,317, filed Dec. 21, 2007, to which the Ser. No. 12/049,928 parent application also claims priority.

BACKGROUND

Field

The present embodiments generally relate to techniques for calibrating the timing of signals involved in performing write operations to a memory for a computer system.

DETAILED DESCRIPTION

Figure 1:
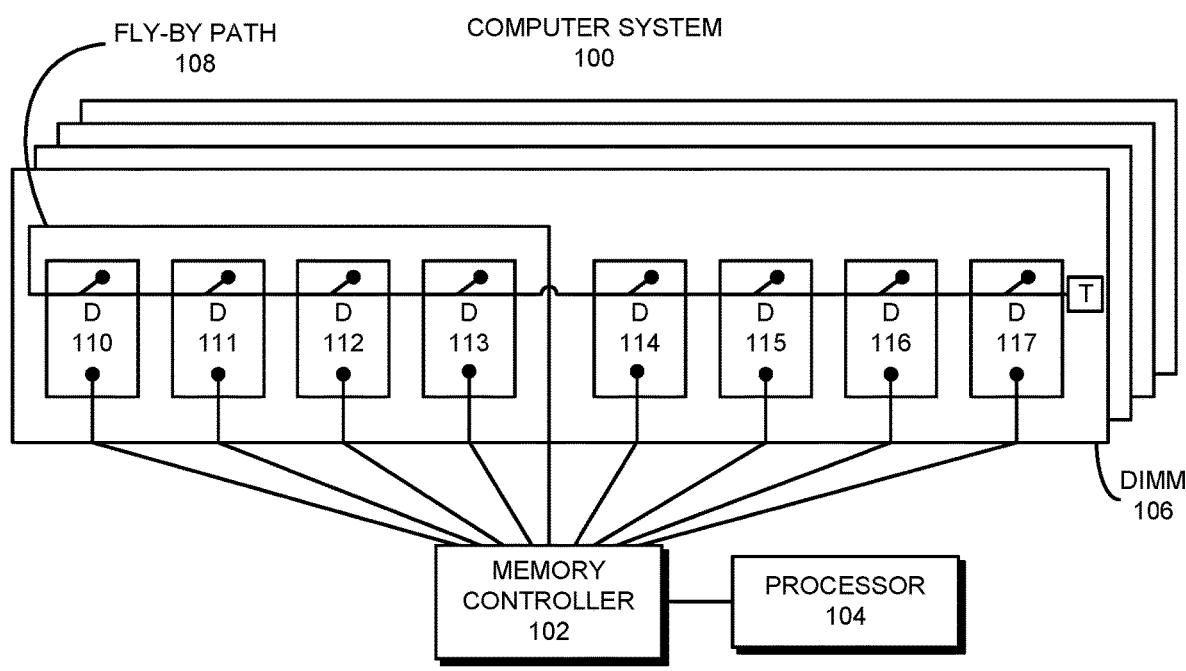
FIG. 1 illustrates an embodiment of a computer system.

The following description is presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present description. Thus, the present description is not intended to be limited to the embodiments shown, but is to be accorded the widest scope consistent with the principles and features disclosed herein.

Embodiments of an apparatus that calibrates timing relationships between signals involved in performing write operations are described. These embodiments include a memory controller which is coupled to a set of memory chips. Each of these memory chips includes a phase detector configured to enable calibration of a phase relationship between a data-strobe signal and a clock signal received at the memory chip from the memory controller. Furthermore, the memory controller is configured to perform one or more write-read-validate operations to calibrate a clock-cycle relationship between the data-strobe signal and the clock signal, wherein the write-read-validate operations involve varying a delay on the data-strobe signal relative to the clock signal by a multiple of a clock period.

In some embodiments, the set of memory chips are coupled to the memory controller through a fly-by topology, wherein the clock signal is routed from the memory controller to the set of memory chips in a multi-drop fashion along a "fly-by path," and wherein data signals and the data-strobe signal are routed from the memory controller to the set of memory chips through direct connections. Note that a "fly-by delay separation" which results from a difference in delay between the clock signal on the fly-by path and the data-strobe signal on a direct path can exceed one clock period. In some embodiments, the memory chips are calibrated in order of increasing delay along the fly-by path.

In some embodiments, while calibrating the phase relationship between the data-strobe signal and the clock signal, the memory controller is configured to assert a pulse on the data-strobe signal at varying delays relative to the clock signal and to look for a transition at the output of the phase detector, wherein the transition indicates that the data-strobe signal is aligned with the clock signal.

In some embodiments, while calibrating the clock-cycle relationship, the memory controller is configured to successively: vary a delay on the data-strobe signal relative to the clock signal by a multiple of a clock period; write a value to a specific location in the memory chip; read a value from the specific location in the memory chip; and determine whether the data-strobe signal and the clock signal are calibrated by validating that the value read from the specific location matches the value written to the specific location.

In some embodiments, the apparatus is configured to sequentially calibrate all memory chips in the set of memory chips.

In some embodiments, the calibration is performed at full memory speed using robust data patterns.

In some embodiments, the memory controller is additionally configured to adjust a timing relationship between the data-strobe signal and the data-strobe enable signal during a read operation.

Some embodiments provide another system for calibrating timing relationships between signals involved in performing write operations in a memory system. During a calibration mode, this system receives signals at a memory chip in a set of memory chips, wherein the signals include a clock signal, a marking signal and a data-strobe signal from a memory controller, and wherein the marking signal includes a pulse which marks a specific clock cycle in the clock signal. Next, the system facilitates calibration of a timing relationship between the data-strobe signal and the clock signal by using the marking signal to window the specific clock cycle in the clock signal, thereby generating a windowed clock signal. Next, the system uses the data-strobe signal to capture the windowed clock signal at a phase detector on the memory chip. Finally, the system returns the captured windowed clock signal to the memory controller so that the memory controller can calibrate the timing relationship.

In some embodiments, the marking signal is communicated from the memory controller to the memory through a selected signal line on the fly-by path, wherein the selected signal line carries another signal when the memory system is not in the calibration mode.

In some embodiments, the selected signal line carries a write-enable signal when the memory system is not in the calibration mode.

In some embodiments, using the data-strobe signal to capture the windowed clock signal involves using the data strobe signal to clock the windowed clock signal into a flip-flop.

In some embodiments, a semiconductor memory device that facilitates calibrating timing relationships between signals involved in performing write operations is disclosed. The memory device includes a clock input to receive a clock signal. In addition, the memory device includes a first input to receive a marking signal from a memory controller. The marking signal includes a pulse which marks a specific clock cycle in the clock signal. The memory device also includes: a second input to receive a data-strobe signal from the memory controller; and a phase detector, which uses the marking signal to window the specific clock cycle in the clock signal, the phase detector also uses the data-strobe signal to capture the windowed clock cycle. The memory device includes an output which provides the captured windowed clock cycle as a feedback signal to the memory controller.

In some embodiments a memory controller is coupled to a memory chip that receives a clock signal, and includes a calibration mode to calibrate a clock-cycle relationship between the data-strobe signal and a clock signal by iteratively: varying a delay on the data-strobe signal relative to the clock signal by a multiple of a clock period; writing a first value to a specific location in the memory chip; reading a second value from the specific location in the memory chip; and determining whether the data-strobe signal and the clock signal are calibrated by validating that the value read from the specific location matches the value written to the specific location.

In some embodiments, the system generates the windowed clock signal by using the rising edge of the clock signal to clock the marking signal through a cascade of flip-flops whose overall latency represents the DRAM write latency. The output of this cascade is then registered on the falling edge of the clock to create the phase-detector enable signal. Next, the system generates the windowed clock signal by logically ANDing the phase-detector enable signal with the clock signal.

Computer System

As memory systems begin to operate at extremely high data rates (for example, greater than 1000 Mega transfers per second ("MT/s")), a "fly-by" memory topology may be used to achieve the required level of signaling performance. For example, see computer system 100 illustrated in FIG. 1, which includes a processor 104 that communicates with a Dual Inline Memory Module ("DIMM") 106 through a memory controller 102. This computer system has a fly-by layout topology, in which control signals, including one or more request (RQ) signal(s) and a clock (CK) signal, are routed from memory controller 102 to multiple synchronous dynamic random access memory ("SDRAM" or "DRAM") chips 110-117. In this embodiment, the control signals and clock signal within DIMM 106 are coupled, in a multi-drop fashion, to each of the DRAM chips 110-117 using a fly-by path 108. Request signals may include address signals and are propagated over signal lines which are, in an embodiment, trace-length matched relative to one-another and the clock signal line. The request signals and the clock signal propagate along the fly-by path 108 and are received by each of the DRAM chips 110-117 in sequence. At the same time, the data-strobe (DQS) and data (DQ) signals are routed directly to each of the DRAM chips 110-117 in DIMM 106, and hence do not incur the delay through the fly-by path.

For each DRAM chip, the data-strobe (DQS) and data (DQ) signals, in one embodiment are routed point-to-point between a dedicated DQ interface port on the memory controller 102 and a DQ interface. In a system that supports multiple ranks, the direct connection may involve routing data-strobe (DQS) and data (DQ) signals between the dedicated DQ interface port on the memory controller 102 and connection points of each DQ interface for corresponding DRAM chips in each rank. A "rank" is a grouping of DRAM chips that contribute to a memory transfer that occurs in response to a memory access command given to the DRAM chips in a rank. In a system that supports multiple DIMM modules (each having either with a single or dual ranks), the direct connection may involve routing between the data-strobe (DQS) and data (DQ) signals between each dedicated DQ interface port on the memory controller and connection points of each DQ interface for corresponding DRAM chips in each DIMM module. (Note that, throughout this specification, a "DRAM chip" may be referred to as "DRAM".)

In an embodiment, the data strobe signal (DQS) may be routed alongside the data signals (DQ) and is used at the receiver of the integrated circuit (i.e., memory controller or DRAM) to receive the data. For example, in a write operation, when the memory controller is transmitting data to a DRAM, the controller sends a DQS signal alongside the data and the DQS signal is used at the DRAM to receive that data. In a read operation, when a DRAM is transmitting data to the memory controller, the DRAM will send a DQS signal alongside the data being transmitted to the controller. The DQS signal, when received by the controller is then used to strobe in the data which accompanied that DQS signal. DQS signals may be transmitted over a single bi-directional signal line for read and write operations, or separate unidirectional signal lines may be provided for respective read/write operations.

In an embodiment featuring a memory system configured with a fly-by layout topology, the RQ/CK propagation delay increases to each DRAM that receives RQ and CK signals from the fly-by signal path. This causes an increasing skew between RQ/CK and DQ/DQS signals received at each successive DRAM. To compensate for this effect during write transactions, memory controller 102 introduces increasing DQ/DQS transmit delay relative to when RQ/CK is transmitted for each successive DRAM. Similarly, during read transactions memory controller 102 introduces increasing DQS read-enable receive sample delays for each successive DRAM. These write and read delays, which are introduced by memory controller 102, are referred to as "write-levelization" and "read-levelization" delays, respectively.

Also, during read transactions, the optimum read-data-alignment setting may increase for each successive DRAM that receives RQ and CK signals from the fly-by signal path, with the DRAM at the end of fly-by signal path requiring the largest read-data-alignment setting. Once this largest read-data-alignment setting is determined, it can be used to calculate settings for all the DQ/DQS groups in order to align the read data received at each of the DQ blocks at memory controller 102.

In an embodiment, DRAM chips which are designed according to the DDR3 standard (JESD79-3 as published by JEDEC Solid State Technology Association) may be provided with built-in circuitry to facilitate timing adjustment. For example, FIG. 2 illustrates a phase-detector circuit within a DRAM chip 200 that facilitates phase adjustments between a clock signal on the fly-by path and a data-strobe signal on a direct path. In this phase-detector circuit, operational amplifier 209 converts a differential clock signal comprised of CK signal 201 and CK# signal 202 into a non-differential clock signal 212. Similarly, operational amplifier 210 converts a differential strobe signal comprised of DQS signal 203 and DQS# signal 204 into a non-differential data-strobe signal 214. The non-differential data-strobe signal 214 is then used to clock the non-differential clock signal 212 into a flip-flop 206. The output of flip-flop 206 feeds through a feedback path 211 and then through a multiplexer 207 and a driver 208 onto a data line DQ 205. Note that multiplexer 207 selectively feeds the output of flip-flop 206 onto data line DQ 205 based on a value of a leveling-mode signal 213. This allows memory controller 102 to determine whether the clock signal 212 and data-strobe signal 214 are phase-aligned, which in turn, enables memory controller 102 (FIG. 1) to calibrate the phase relationship between the data-strobe signal 214 and the clock signal 212 by asserting a pulse on data-strobe signal 214 at varying delays relative to clock signal 212 and looking for a transition at the output of the phase detector which appears on data line DQ 205.

In the embodiment described above in reference to FIG. 2, situations may exist where the resulting timing adjustment provided by the above-described phase-detector circuit may not be correct because write/read data integrity is not verified during the adjustment process. In particular, if the fly-by delay separation between the clock signal and the data-strobe signal exceeds one clock period, the above-described timing adjustment process will adjust the phase relationship properly, but the timing adjustment may be off by a multiple of a clock period.

To account for such situations, embodiments are presented below that verify write/read data integrity during the timing-adjustment process. In doing so, they write and read robust data patterns to and from the DRAM of interest, as well as simultaneously communicating data patterns to the other DRAMs in the topology, so that realistic switching noise effects may be accounted for during the timing-adjustment process.

DRAM Calibration Process

Figure 3:
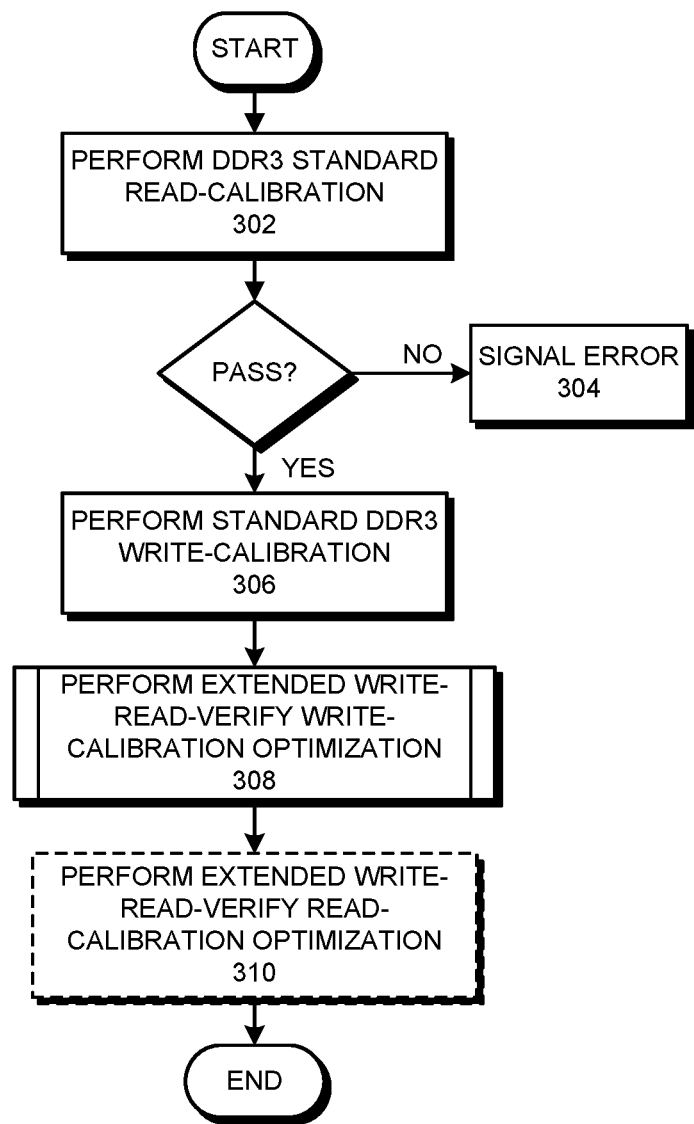
FIG. 3 presents a flow chart illustrating an embodiment of a memory-timing calibration process.

FIG. 3 presents a flow chart illustrating an embodiment of a memory timing calibration process. In this embodiment, there are a few assumptions for this calibration process: (1) It is assumed that the timing relationship between request (RQ) and clock (CK) signals has been set to compensate for the estimated average skew between RQ and CK; (2) It is assumed that the timing relationship between data signals (DQ) and data-strobe signal (DQS) for each DQ/DQS group has been set to compensate for the estimated average skew between DQ and DQS; (3) It is also assumed that DRAMs will be processed in successive order of increasing RQ/CK delay; and (4) It is additionally assumed that the skew between any two DQ/DQS groups is much less than one CK cycle.

Figure 2:
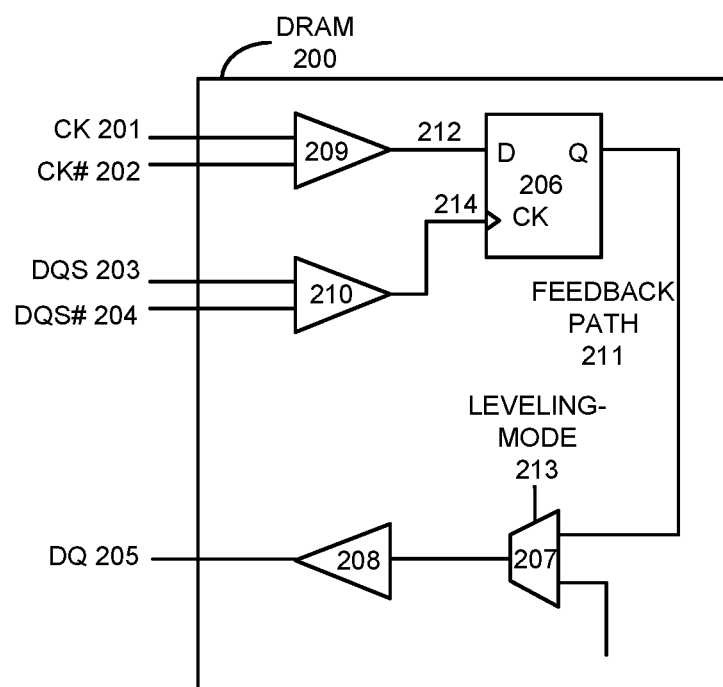
FIG. 2 illustrates an embodiment of a phase detector.

Referring to FIG. 3, the process starts by performing a read-calibration (read-leveling) process (operation 302) in which a register or other storage on each DRAM (of a set of DRAMS coupled to the flyby RQ and direct DQ topology as shown in FIG. 1) provides a predefined data pattern to the controller. The DRAM situated closest to the controller on the fly-by RQ bus and (thus having the shortest RQ/CK flight time delay) transmits the predefined data pattern before the DRAM situated furthest to the controller on the fly-by RQ bus (thus having the longest RQ/CK flight time delay). The controller can then determine the receive timing offset for each receive DQ block in the controller by, for example, adjusting its read data strobe enable delay to be properly aligned with the received read data strobe whose arrival time results from the propagation delay of a read command being received at the corresponding DRAM.

If the system does not pass the calibration process in operation 302, the system signals an error (operation 304). Otherwise, the system performs a write-calibration (write-leveling) process (operation 306). (Note that this write-calibration process, in an embodiment, may make use of the phase-detector circuit located in each DRAM as is illustrated in FIG. 2.) In an embodiment the write calibration process involves providing a DQS strobe signal that each DRAM (of a set of DRAMS coupled to the flyby RQ and direct DQ topology as shown in FIG. 1) uses to sample the clock signal CK and outputs the result over the direct DQ lines back to the controller. In the write—calibration process, the controller can then determine transmit timing offsets for each transmit DQ block on the controller to, for example, levelize write data skew that results from the propagation delay of a corresponding write command being received in succession at each DRAM.

After the write calibration process (operation 306), the clock and data-strobe signals should be phase-aligned, but the timing of these signals may still be misaligned by a multiple of a clock period. In order to remedy this problem, in an embodiment, the system performs an extended write-read-verify write-calibration optimization (operation 308). (This process is described in more detail below with reference to FIG. 4.) The system can additionally perform an extended write-read-verify read-calibration optimization (operation 310).

Figure 4:
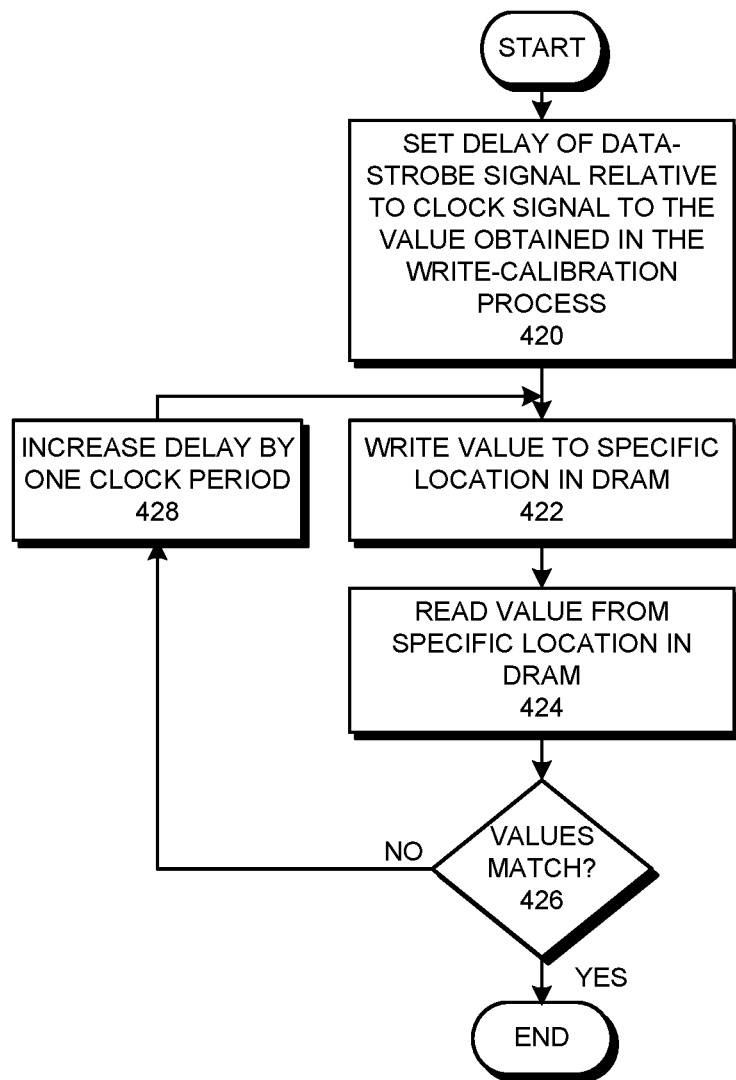
FIG. 4 presents a flow chart illustrating an embodiment of a write-read-verify process to calibrate memory timing.

FIG. 4 presents a flow chart illustrating an example of a write-read-verify process to calibrate write timing. At the start of this process, the system sets the delay of the data-strobe signal relative to the clock signal to the value obtained in the write calibration process (operation 420). This assumes that the write calibration process began its DQS delay search with the minimum delay setting. Next, the system writes a value to a specific location in the DRAM (operation 422) and then reads a value from the same location (operation 424). Then, the system determines if the value written to the memory location and the value read from the memory location match (operation 426). If not, the system increases the delay by one clock period (operation 428) and returns to operation 422. On the other hand, if the values match, the write operation was successful, which indicates that the system is calibrated and hence the calibration process is complete.

Read-Data-Alignment Calibration

In an embodiment, the system additionally has to be calibrated to compensate for misalignment of read data from different DRAM devices. Read data from successive DRAM devices, configured in a system that uses the fly-by topology, arrive at the memory controller with successively increasing delay. In an embodiment, a read alignment process involves queuing read data within successive DQ receiver blocks at the controller.

After read data from different DRAM devices arrives at the memory controller with successively increasing delay, it is received by a circuit on the controller that temporary stores the read data before the read data is internally aligned to the controller clock and then processed further. "Read-alignment" (also referred to as "read-data-alignment") involves synchronizing the read data to the same clock signal as the read data comes out of, for example a first in, first out buffer ("FIFO") in the memory controller and is provided to the core of the memory controller. This clock signal is not the same as the read data strobe enable signal which is different for each slice of data and enables data to be written into the FIFO. A buffer circuit and/or flip-flop circuit elements may be used in place of or in conjunction with the FIFO.

Figure 5:
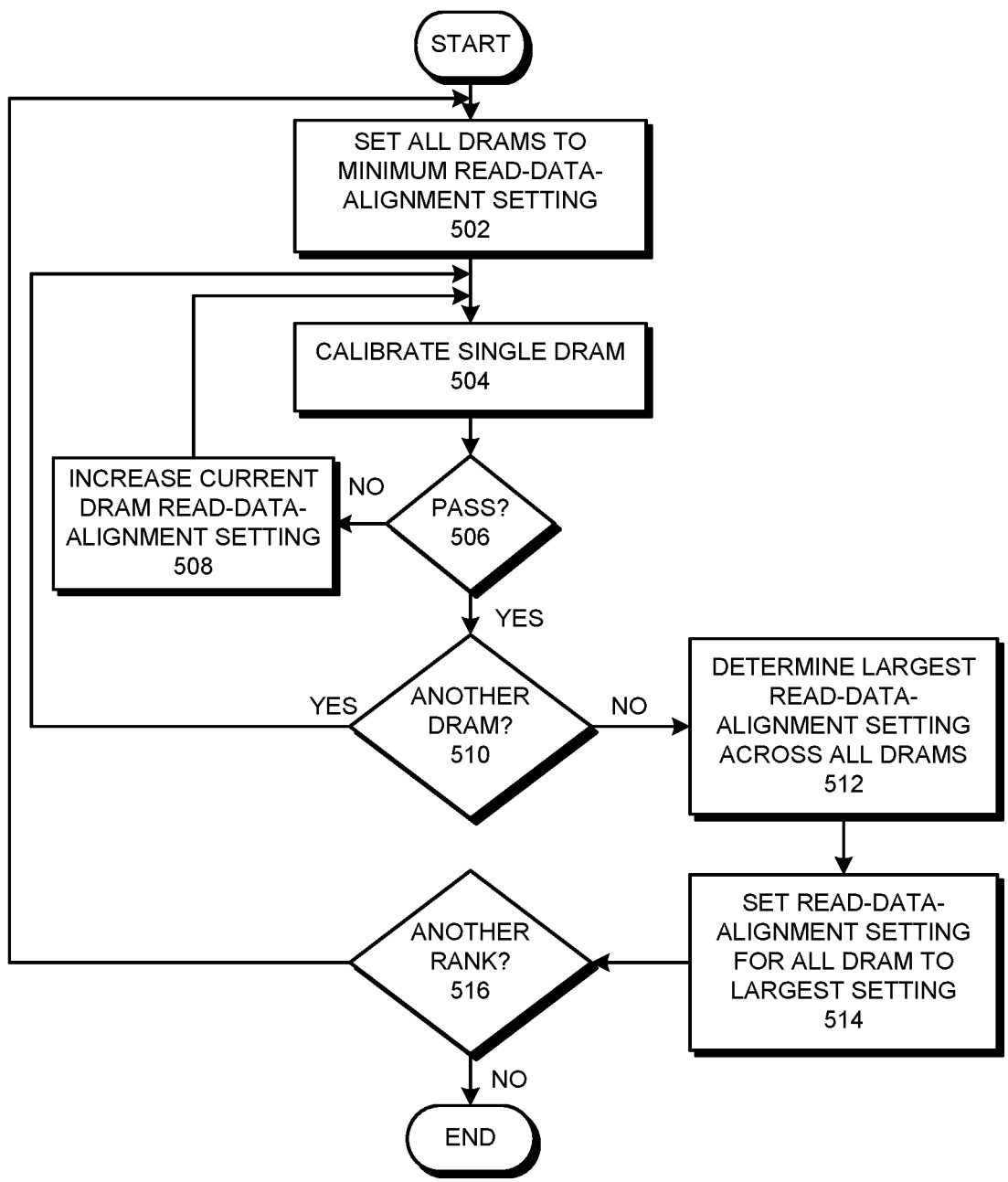
FIG. 5 presents a flow chart illustrating an example of a process for calibrating a read-data-alignment setting.

More specifically, FIG. 5 presents a flow chart illustrating an embodiment of a process for calibrating a read-data-alignment setting. The system starts by setting all DRAMs to a minimum possible read-data-alignment setting (operation 502). Next, the system calibrates a single DRAM using the technique described previously in FIG. 3 (operation 504) and then determines whether the DRAM passes the calibration process (operation 506). If the DRAM does not pass the calibration process, the system increases the current read-data-alignment setting (operation 508) and returns to operation 504. Otherwise, if the DRAM passes the calibration process, the system determines if there exists another DRAM to calibrate (operation 510). If so, the system returns to operation 504 to calibrate the next DRAM. Otherwise, the system determines the largest read-data-alignment setting across all DRAMs (operation 512) and sets to read-data-alignment setting for all DRAMs to this largest setting (operation 514).

Next, the system determines if there exists another rank of DRAMs to calibrate (operation 516). If so, the system returns to operation 502 to calibrate the next rank of DRAMs. Otherwise, if there are no additional ranks of DRAMs, the process is complete.

Figure 6:
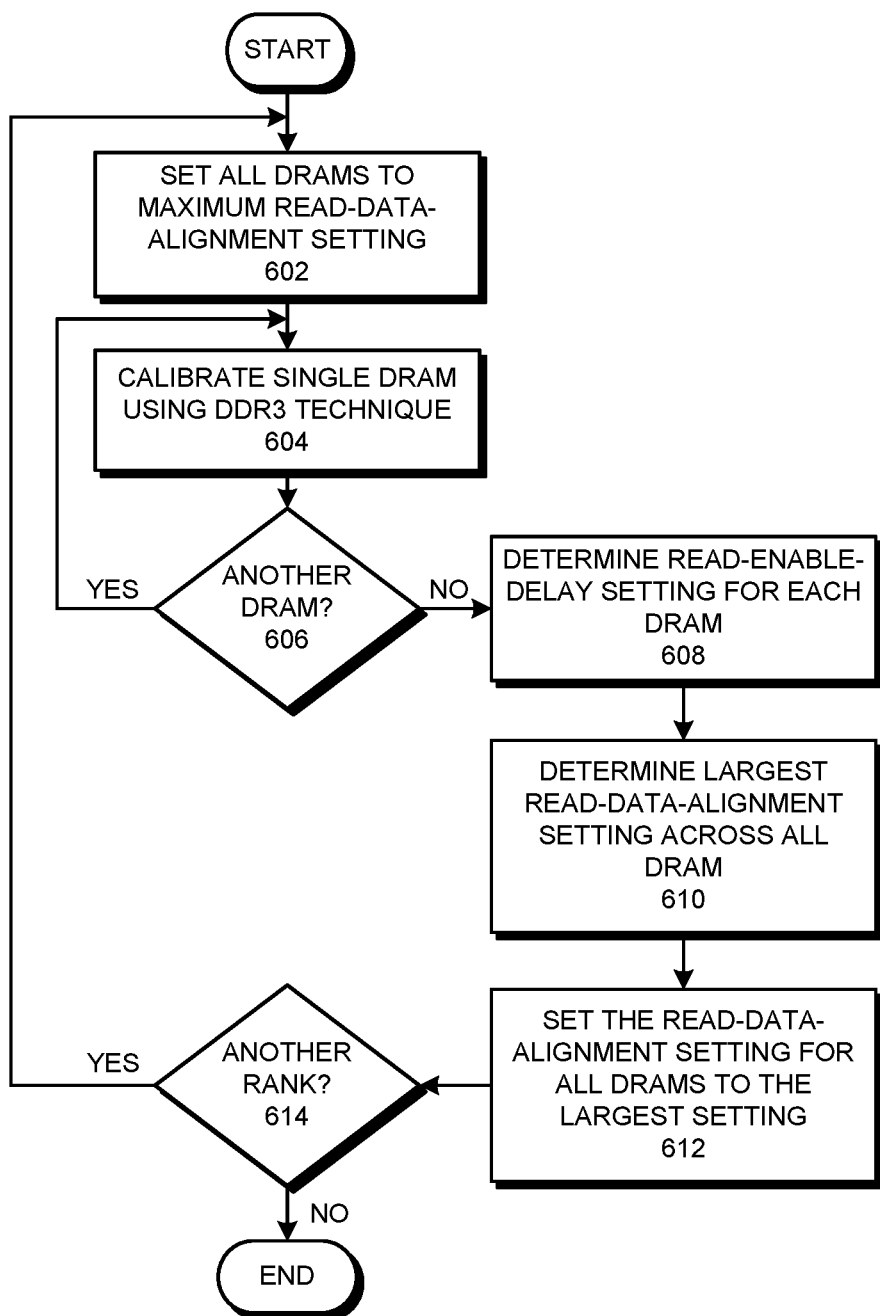
FIG. 6 presents a flow chart illustrating another example of a process for calibrating a read-data-alignment setting.

In an alternative embodiment, which is illustrated in FIG. 6, the read-alignment setting is initialized to a maximum possible setting and is then decreased. More specifically, in this alternative embodiment, the system starts by setting all DRAMs to a maximum possible read-data-alignment setting (operation 602). Next, the system calibrates a single DRAM using the technique described previously in FIG. 3 (operation 604) and determines if there exists another DRAM to calibrate (operation 606). If so, the system returns to operation 604 to calibrate the next DRAM. Otherwise, the system determines the read-enable-delay setting for each DRAM (operation 608) and then determines a largest read-data-alignment setting across all DRAMs (operation 610). The system then sets the read-data-alignment setting for all DRAMs to this largest setting (operation 612).

Next, the system determines if there exists another rank of DRAMs to calibrate (operation 614). If so, the system returns to operation 602 to calibrate the next rank of DRAMs. Otherwise, if there are no additional ranks of DRAMs, the process is complete.

2D Write-Read-Verify Calibration Technique for a Single DRAM

Figure 7:
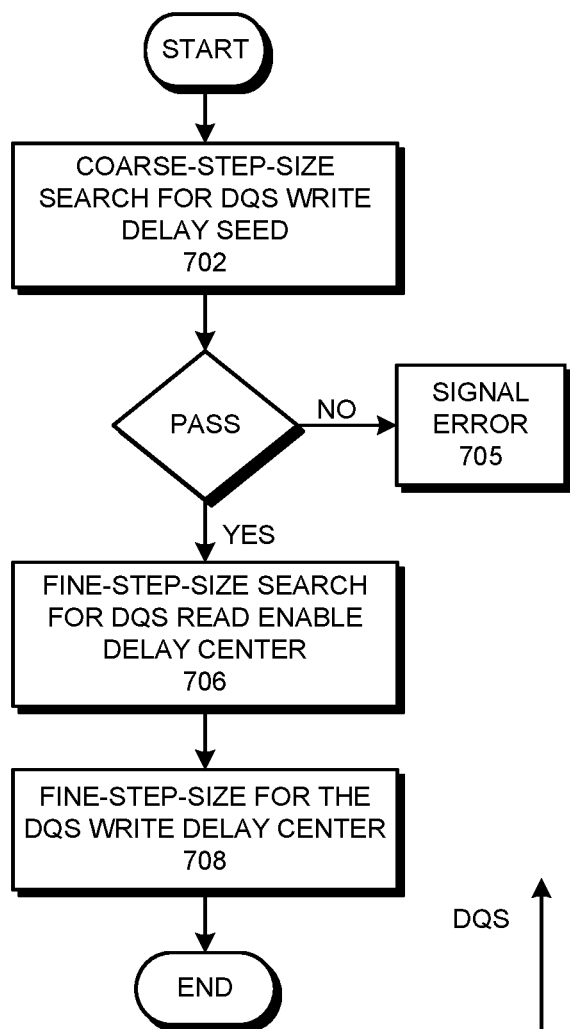
FIG. 7 presents a flow chart illustrating another example of a memory-timing calibration process.

FIG. 7 presents a flow chart illustrating an alternative embodiment for a memory-timing calibration process which uses a two-dimensional ("2D") Write-Read-Verify calibration technique. This 2D search technique uses a two-pass approach. The first pass uses coarse-step-sizes for transmit and receive phase settings (write and read levelization delays, respectively) (operation 702). Starting from the origin of the 2D search region, the system first incrementally steps the transmit phase. For each transmit phase, the system attempts to find a "coarse-pass" region by incrementally stepping the receive phase. The system continues to step through the transmit phase until a sufficiently large coarse-pass region is found. When this occurs, the first pass is terminated and the latest transmit phase is used as a seed for the second pass of the technique.

If the system does not find a coarse-pass region and hence does not pass the first phase, the system signals an error (operation 705).

Otherwise, if the system successfully finds a coarse-pass region, the system performs a fine-step-size search for the DQS read-enable-delay center (operation 706), and then performs a fine-step-size search for the DQ/DQS write-delay center (operation 708). More specifically, starting with the seed generated during the first-pass transmit phase, the second pass uses a fine step size for the receive phase setting to find the entire pass region around the first-pass transmit phase. It then finds the center of this region, and uses the center receive phase as the optimum receive phase setting. Starting at the center receive phase, the second pass then uses a fine step size for the transmit phase setting to find the entire pass region around the center receive phase setting. The system then finds the center of this region, and uses the center transmit phase as the transmit phase setting.

Note that the above-described 2D calibration technique can for example be used with DDR2 SDRAM chips or other types of memory devices. Hence, the flow diagram of FIG. 5 can be used by substituting the 2D technique into operation 504. Alternatively, the flow diagram of FIG. 6 can be used by substituting the 2D technique into operation 604.

Figure 8:
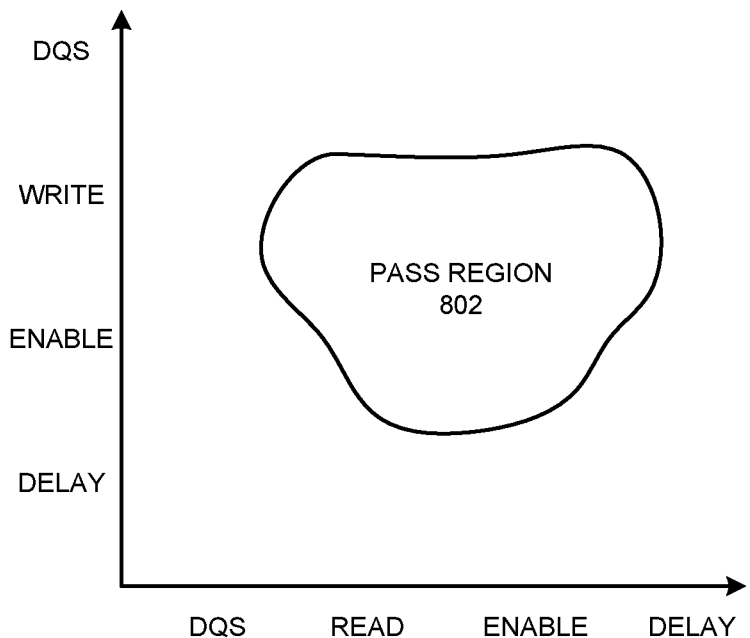
FIG. 8 presents a graph illustrating pass-fail regions.

FIG. 8 presents a graph illustrating pass-fail regions. Note that the above-described 2D search will identify a 2D pass region 802 for all possible combinations of read-enable delays and write-enable delays.

Phase-Detector Circuit 1

Figure 9:
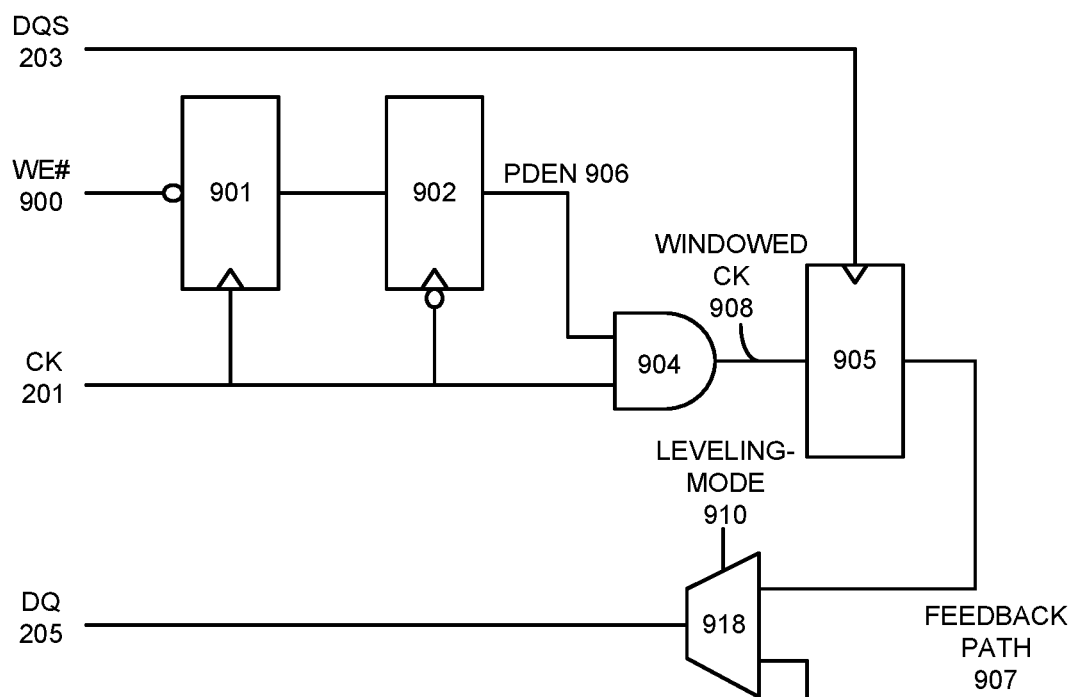
FIG. 9 illustrates an embodiment of a modified phase-detector circuit.

FIG. 9 illustrates an embodiment of a phase-detector circuit which, for example, may facilitate write timing calibration for DRAM fly-by delay separations greater than one clock cycle. In this phase-detector circuit, a marking pulse is received on, for example, a write enable ("WE#") signal line 900, and this marking pulse is fed through two D-flops 901 and 902, which are clocked on alternate rising and falling edges of the clock signal 201. This generates a phase-detector enable signal (PDEN) 906 with a window for the desired time slot. PDEN signal 906 is then ANDed with clock signal 904 to generate a windowed clock signal 908. In an embodiment WE# is routed and propagates alongside CK along the fly-by path.

Data-strobe signal (DQS) 203 is then used to clock the windowed clock signal 908 into a flip-flop 905. The output of flip-flop 905 feeds through a feedback path 905 and then through a multiplexer 918 onto a data line DQ 205. Note that multiplexer 918 selectively feeds the output of flip-flop 206 onto data line DQ 205 based on a value of a leveling-mode signal 910.

This feedback signal enables the memory controller to determine whether the clock signal 201 and DQS 203 are aligned, which in turn, enables the memory controller to calibrate the timing relationship between the DQS 203 and the clock signal 201 by asserting a pulse on DQS 203 at varying delays relative to clock signal 201 and looking for a transition at the output of the phase detector which appears on data line DQ 205.

Note that any command or control line on the fly-by path can be used to communicate this marking pulse. Hence, it is not necessary to use the specific command line WE#, because another command or control line can be used in place of the WE# command line for this purpose (for example, command lines such as RAS#, CAS#, or control lines such as chip select (CS#) or clock enable (CKE#) may be used in place of WE# in various embodiments). In this embodiment, the WE# command line is used since it is associated with a memory write function in normal operation (i.e., non calibration mode operation).

After windowed clock signal 908 is generated, DQS signal 203 is used to clock windowed clock signal 908 into a flip-flop 905. In similar fashion to the circuit illustrated in FIG. 2, the output of flip-flop 905 feeds through a feedback path 907, in through a multiplexer 918, and onto a data line DQ 205. During this process, multiplexer 918 selectively feeds the output of flip-flop 905 onto data line DQ 205 based on a value of a leveling-mode signal 910. Hence, during a leveling mode of operation, the memory controller is able to determine whether the windowed clock signal 908 and data-strobe signal DQS 203 are phase-aligned. This enables the memory controller to calibrate the timing relationship between the DQS signal 203 and the windowed clock signal 908 by asserting a pulse on DQS signal 203 at varying delays relative to windowed clock signal 908 and by looking for a transition at the output of the phase detector which appears on data line DQ 205.

However, in the case where the DRAM fly-by delay separation exceeds one clock cycle, the circuit illustrated in FIG. 9 will only generate a zero-to-one transition if DQS signal 203 and clock signal 201 are phase aligned and are additionally aligned on the proper clock cycle. This is unlike the circuit illustrated in FIG. 2 which generates a zero-to-one transition in cases where DQS signal 203 and clock signal 201 are phase aligned but are not aligned on the proper clock cycle.

Calibration Process

Figure 10:
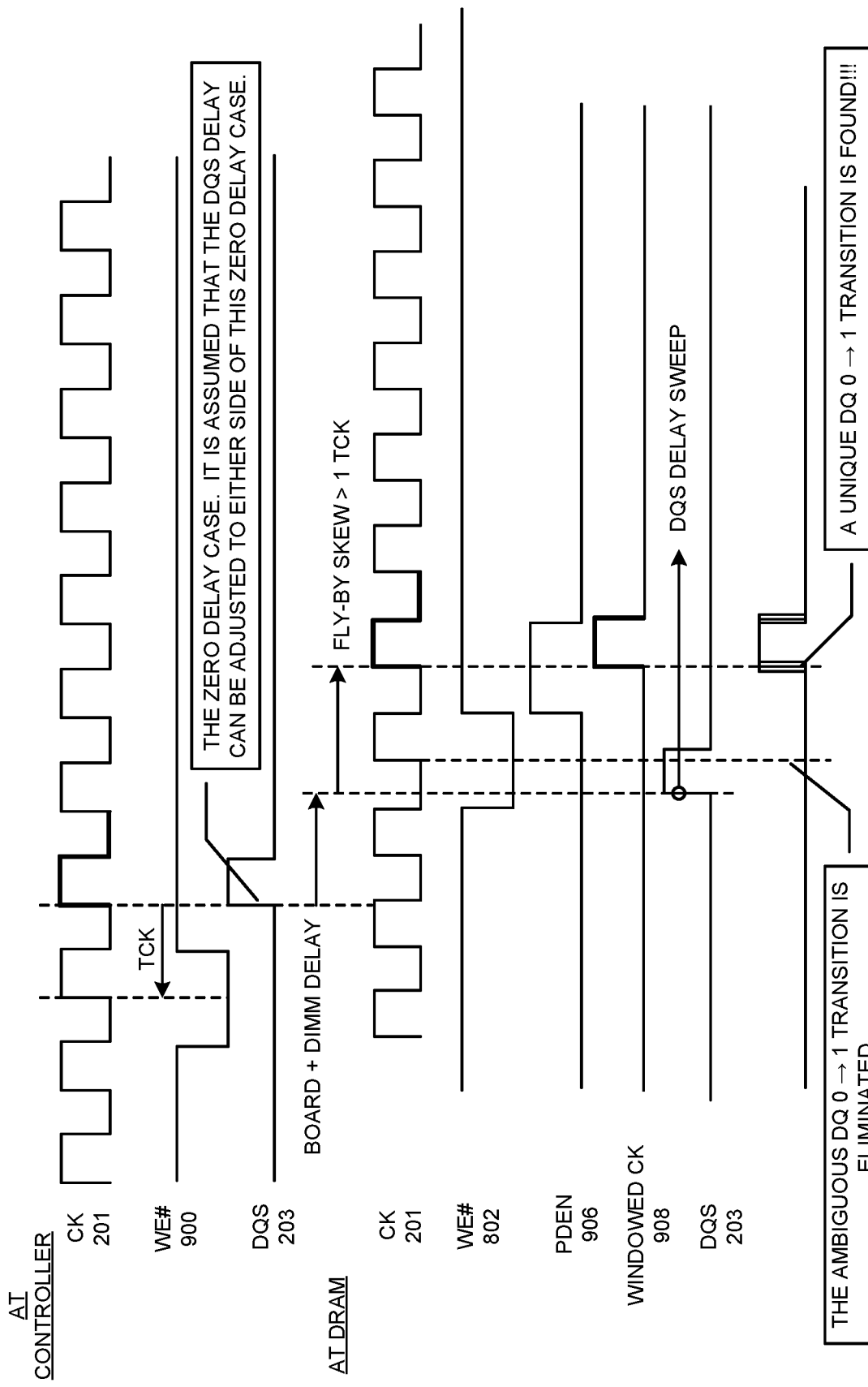
FIG. 10 presents a timing diagram illustrating an example of a calibration process.

FIG. 10 presents a timing diagram illustrating an example of a calibration process which uses the circuitry illustrated in FIG. 9. The top portion of FIG. 10 illustrates the timing of signals at the memory controller and the bottom portion of FIG. 10 illustrates the timing of signals at the memory chip (DRAM). In FIG. 10, the controller sends a clock signal (CK 201) and a data-strobe signal (DQS 203) to the DRAM.

As is illustrated in FIG. 10, a DQS pulse is asserted by the controller. In this embodiment, CK and all DQS signals to the DIMM containing the DRAM are routed with equal length traces on the circuit board. After the time of flight on the circuit board, CK and DQS propagate to each DRAM in the DIMM. During this process, the DQS signals are routed with equal length to each DRAM within the DIMM. However, the CK is routed to each DRAM successively along a fly-by path. This results in successively increasing skew between CK and DQS at each DRAM along the fly-by path.

As memory clock speeds continue to increase, these DRAM fly-by delay separations begin to exceed one clock cycle. This causes CK-versus-DQS skews which are greater than one clock cycle. In an embodiment, at least one command signal (e.g., WE#) is routed and propagates alongside CK along the fly-by path.

As is illustrated by the arrow attached to the DQS pulse at the DRAM in FIG. 10, the calibration process sweeps the DQS pulse delay relative to CK to find a zero-to-one transition at the output of the standard phase detector. Detection of a zero-to-one transition is an indicator of correct CK vs. DQS phase alignment.

Note that the memory controller asserts the WE# signal 900 one clock cycle before the DQS pulse is asserted. After signal propagation between the memory controller and the DRAM, more than one clock cycle of skew exists between CK signal 201 and DQS signal 203. As shown in the circuitry illustrated in FIG. 9, the WE# signal 900 is staged and inverted to window the desired CK time slot. The resulting window signal, PDEN, is then used to prevent detections of false transitions as illustrated at the bottom of FIG. 10.

Phase Detector Circuit II

Figure 11:
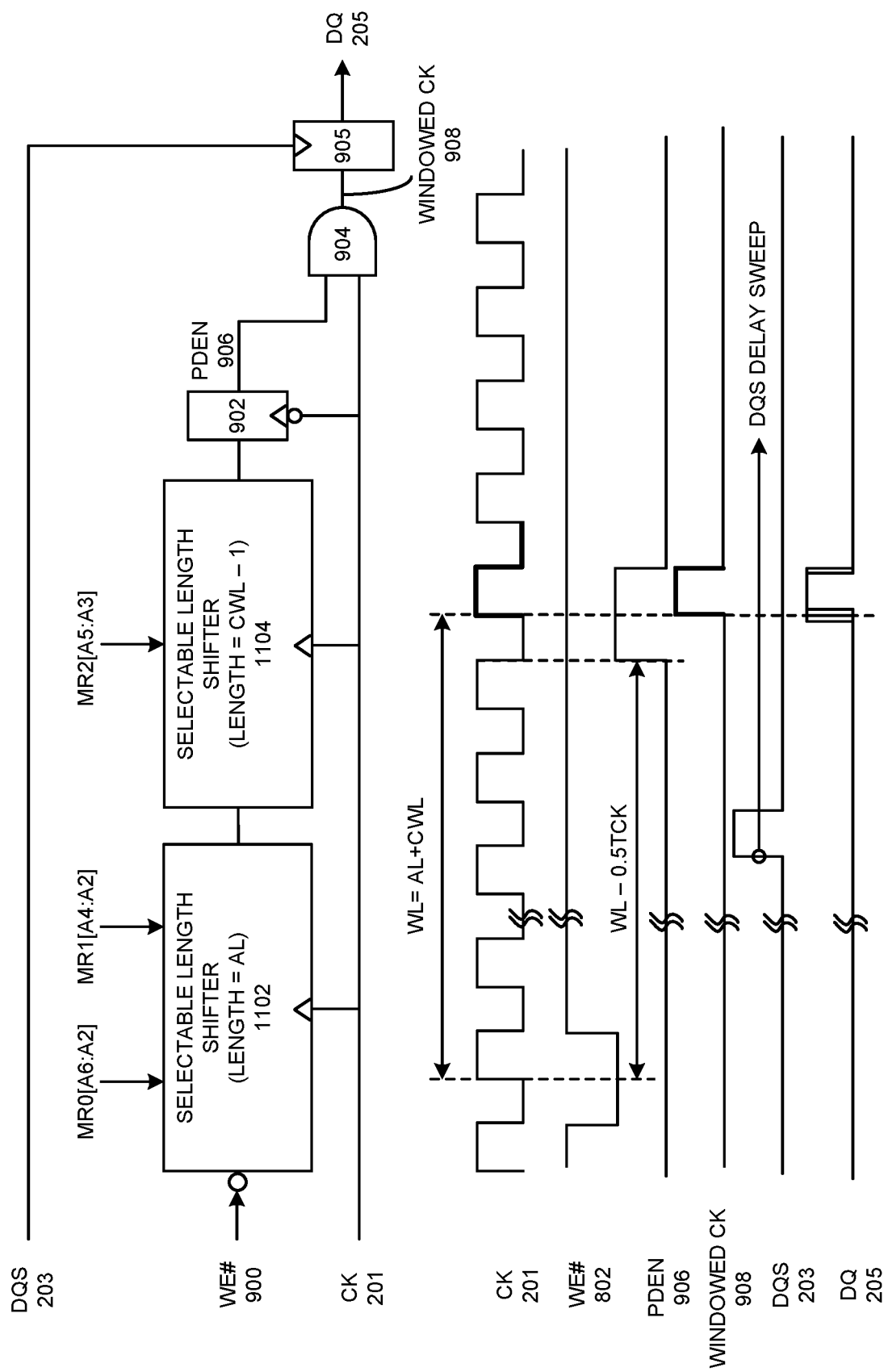
FIG. 11 illustrates a variation of a calibration phase-detector circuit along with an associated timing diagram.

FIG. 11 illustrates an embodiment of a phase-detector circuit that may be utilized in a DRAM, along with an associated timing diagram. This embodiment is similar to the embodiment illustrated in FIG. 9, except that WE# signal 900 is staged through staging circuitry for the WE# signal 900 on the DRAM (instead of through flip-flop 901).

More specifically, WE# signal 900 is staged through a first selectable-length shifter 1102 for additive latency (AL) with a delay programmed to be AL, and a second selectable-length shift register 1104 for CAS write latency (CWL) with a delay programmed to be=CWL-1, wherein the "1" represents the delay through flip-flop 902. Additive latency is a programmable delay between receipt of a column command (e.g., a read or write command) at the DRAM and the internal application or posting of that command that signifies when execution of that command is commenced internally. Write latency is the programmable delay between the internal application or posting of the write command and when data associated with that write command is sampled by the DRAM. By using this staging circuitry, the memory controller can perform the write-calibration process using the same write latency that results during normal operation.

Calibration Process

Figure 12:
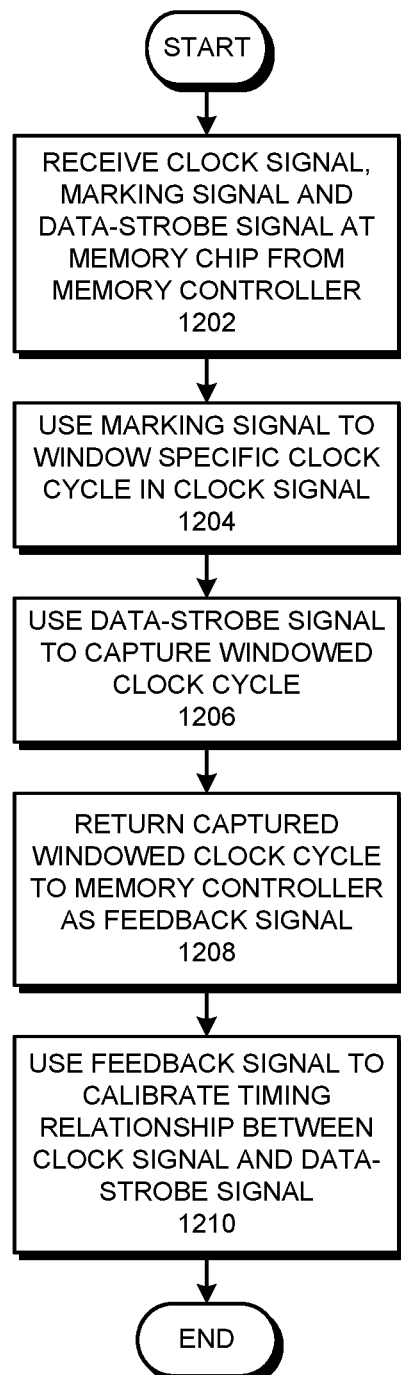
FIG. 12 presents a flow chart illustrating an example of a write-timing calibration process.

FIG. 12 presents a flow chart illustrating an embodiment of a write timing calibration process. During this process, a clock signal, a marking signal and a data-strobe signal are sent to a memory chip from a memory controller (operation 1202). Next, the marking signal is used to "window" a specific clock cycle in the clock signal (operation 1204). This generates a windowed clock signal.

Next, a pulse on the data-strobe signal is used to capture the windowed clock signal in a memory element (operation 1206). This captured windowed clock signal is then returned to the memory controller as a feedback signal (operation 1208).

The memory controller then uses the feedback signal to calibrate a timing relationship between the clock signal and the data-strobe signal (operation 1210). For example, this calibration process can involve asserting a pulse on the data-strobe signal at varying delays relative to the clock signal and look for a transition at the output of the phase detector, wherein the transition indicates that the data-strobe signal is aligned with the clock signal.

Note that the FIGS. 1-12 may include fewer components or operations, or additional components or operations. Moreover, two or more components or operations can be combined into a single component or operations, and/or the position of one or more components or operations can be changed.

Additionally, components and/or functionality illustrated in FIGS. 1-12 may be implemented using analog circuits and/or digital circuits. Furthermore, components and/or functionality in FIGS. 1-12 may be implemented using hardware and/or software.

Devices and circuits described herein may be implemented using computer-aided design tools available in the art, and embodied by computer-readable files containing software descriptions of such circuits. These software descriptions may be: behavioral, register transfer, logic component, transistor and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 13:
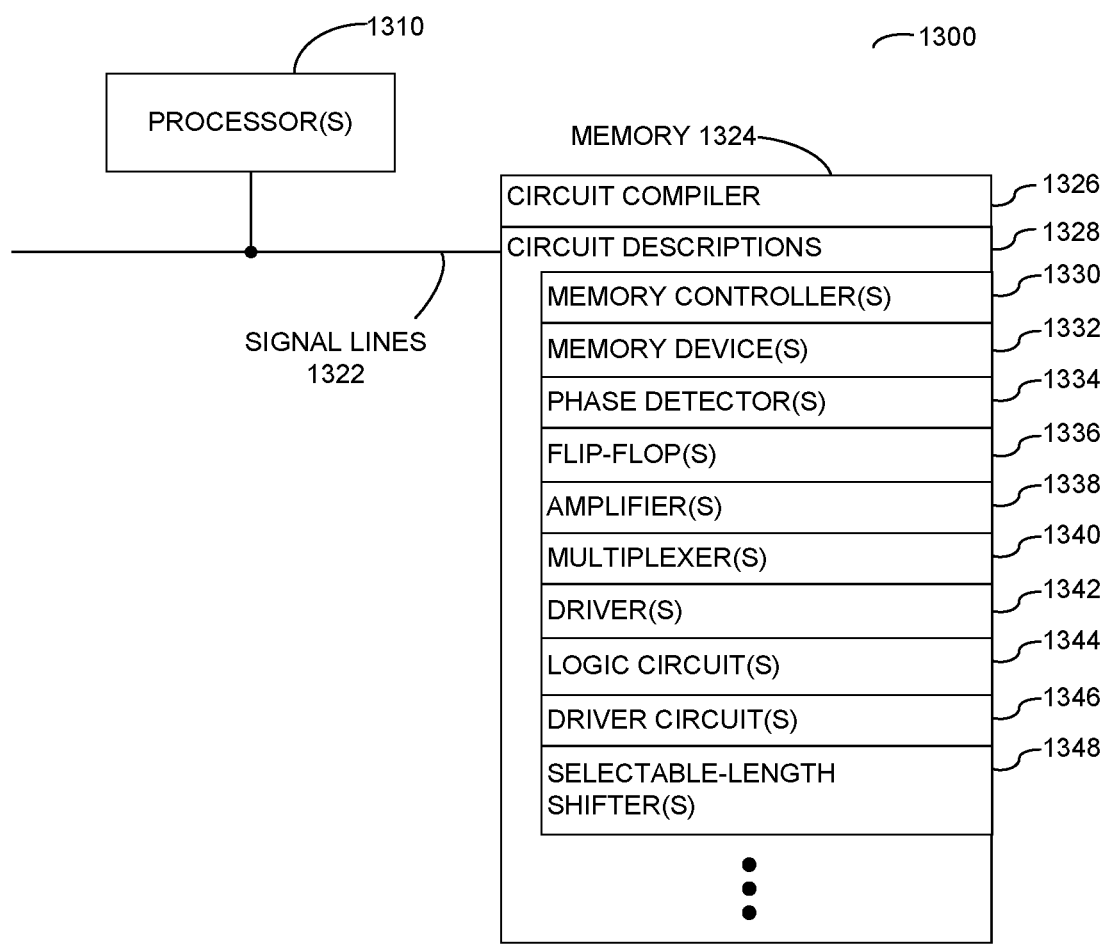
FIG. 13 is a block diagram illustrating an embodiment of a system.

FIG. 13 presents a block diagram illustrating an embodiment of a system 1300 that stores such computer-readable files. This system may include at least one data processor or central processing unit (CPU) 1310, memory 1324 and one or more signal lines or communication busses 1322 for coupling these components to one another. Memory 1324 may include random access memory and/or non-volatile memory, such as: ROM, RAM, EPROM, EEPROM, flash, one or more smart cards, one or more magnetic disc storage devices, and/or one or more optical storage devices.

Memory 1324 may store a circuit compiler 1326 and circuit descriptions 1328. Circuit descriptions 1328 may include descriptions of the circuits, or a subset of the circuits discussed above. In particular, circuit descriptions 1328 may include circuit descriptions of: one or more memory controllers 1330, one or more memory devices 1332, one or more phase detectors 1334, one or more flip-flops 1336, one or more amplifiers 1338, one or more multiplexers 1340, one or more drivers 1342, one or more logic circuits 1344, one or more driver circuits 1346, and/or one or more selectable-length shifters 1348.

Note that the system 1300 may include fewer components or additional components. Moreover, two or more components can be combined into a single component and/or the position of one or more components can be changed.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A method of operation in a memory controller to control operation of a dynamic random access memory device (DRAM), the memory controller including a clock driver to transmit a clock signal to the DRAM, the method comprising:
    writing first data to a location in the DRAM, the writing including
        transmitting a write command to the DRAM, the write command synchronized to the clock signal;
        transmitting a write strobe signal to the DRAM, the write strobe signal delayed relative to the clock signal by a first delay, the write strobe signal accompanying the first data and used by the DRAM to sample the first data;
    reading the first data from the location in the DRAM to generate read data;
    verifying whether the read data matches the first data; and
    conditionally adjusting the first delay by at least one clock period to generate an adjusted delay, the conditionally adjusting based on the verifying.

2. The method according to claim 1, wherein the conditionally adjusting comprises:
    conditionally adjusting the first delay by an integer number of clock cycles if the read data fails to match the first data.

3. The method according to claim 1, wherein the conditionally adjusting comprises conditionally adjusting the first delay by a single clock period, the method further comprising:
    iteratively performing the writing, reading, verifying and conditionally adjusting steps until the read data matches the first data.

4. The method according to claim 1, wherein:
    the first delay is determined through a write calibration process prior to the writing of the first data to a location in the DRAM, the write calibration process including a delay search to determine the first delay, the delay search beginning with a minimum delay setting.

5. The method according to claim 1, wherein the clock signal is routed along a flyby path between the memory controller and multiple DRAM devices, and wherein the method further comprises:
    performing the writing, reading, verifying and conditionally adjusting steps for each of the multiple DRAM devices to generate a corresponding adjusted delay.

6. The method according to claim 1, wherein:
    the writing, reading, verifying and conditionally adjusting steps are carried out in a calibration mode of operation.

7. The method according to claim 6, further comprising:
    during a normal mode of operation, using the adjusted delay for read and write operations between the memory controller and the DRAM.

8. A memory controller to control the operation of a dynamic random access memory (DRAM) device, the memory controller comprising:
    a clock driver to transmit a clock signal to the DRAM device;
    a command driver to transmit a write command to the DRAM device for a first write operation, the write command synchronized to the clock signal for writing first data to a specified location in the DRAM device;
    a strobe driver to transmit a write strobe signal to the DRAM device, the write strobe signal delayed relative to the clock signal by a first delay, the write strobe signal accompanying the first data and used by the DRAM to sample the first data;

a receiver to receive read data resulting from a read operation from the specified location after the writing of the first data; and delay adjustment circuitry to conditionally adjust the first delay by at least one clock period of the clock based on a verification of whether the read data matches the first data.

9. The memory controller according to claim 8, wherein:
the delay adjustment circuitry is operative to adjust the first delay by an integer number of clock cycles if the read data fails to match the first data.

10. The memory controller according to claim 8, wherein:
the delay adjustment circuitry is operative to perform iterative delay adjustments corresponding to iterative write, read and verification operations.

11. The memory controller according to claim 8, wherein:
the first delay is determined through a write calibration process prior to the writing of the first data to a location in the DRAM, the write calibration process including a delay search to determine the first delay, the delay search beginning with a minimum delay setting.

12. The memory controller according to claim 8, wherein the clock signal is routed along a flyby path between the memory controller and multiple DRAM devices, and wherein:
the delay adjustment circuitry is operative to perform iterative delay adjustments corresponding to separate write, read and verification operations for each of the multiple DRAM devices to generate a corresponding adjusted delay for each of the DRAM devices.

13. The memory controller according to claim 8, wherein:
the delay adjustment circuitry operates in a calibration mode of operation.

14. The memory controller according to claim 13, wherein:
the corresponding adjusted delays for each of the DRAM devices are used by the memory controller in a normal mode of operation.

15. An integrated circuit (IC) device to control dynamic random access memory (DRAM) device, the IC device comprising:
command/address (C/A) circuitry to transmit, to the DRAM device,
a clock signal, and
a write command for a first write operation, the write command synchronized to the clock signal for writing first data to a specified location in the DRAM device;
data interface circuitry to transmit, to the DRAM device, the first data,
a write strobe signal, the write strobe signal delayed relative to the clock signal by a first delay, the write strobe signal accompanying the first data and used by the DRAM to sample the first data;
wherein the data interface circuitry further includes receiver circuitry to receive read data resulting from a read operation from the specified location after the writing of the first data; and
delay circuitry to apply the first delay and to conditionally adjust the first delay by at least one clock period of the clock signal based on a verification of whether the read data matches the first data.

16. The IC device according to claim 15, wherein:
the delay circuitry is operative to conditionally adjust the first delay by an integer number of clock cycles if the read data fails to match the first data.

17. The IC device according to claim 15, wherein:
the delay adjustment circuitry is operative to perform iterative delay adjustments corresponding to iterative write, read and verification operations.

18. The IC device according to claim 17, wherein:
the first delay is determined through a write calibration process prior to the writing of the first data to a location in the DRAM, the write calibration process including a delay search to determine the first delay, the delay search beginning with a minimum delay setting.

19. The IC device according to claim 18, wherein the clock signal is routed along a flyby path between the memory controller and multiple DRAM devices, and wherein:
the delay circuitry is operative to perform iterative delay adjustments corresponding to separate write, read and verification operations for each of the multiple DRAM devices to generate a corresponding conditionally adjusted delay for each of the DRAM devices.

20. The IC device according to claim 15, wherein:
the delay circuitry performs the conditionally adjustment of the first delay during a calibration mode of operation.

\* \* \* \* \*